United States Patent
Hiehata et al.

(10) Patent No.: US 8,421,582 B2
(45) Date of Patent: *Apr. 16, 2013

(54) ESD PROTECTION DEVICE AND MANUFACTURING METHOD THEREFOR

(75) Inventors: Kumiko Hiehata, Nagaokakyo (JP); Takahiro Sumi, Nagaokakyo (JP); Jun Adachi, Nagaokakyo (JP); Jun Urakawa, Nagaokakyo (JP); Takayuki Tsukizawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/407,790

(22) Filed: Feb. 29, 2012

(65) Prior Publication Data

US 2012/0169452 A1    Jul. 5, 2012

Related U.S. Application Data

(63) Continuation of application No. PCT/JP2010/066905, filed on Sep. 29, 2010.

(30) Foreign Application Priority Data

Sep. 30, 2009    (JP) .................................. 2009-227200

(51) Int. Cl.
*H01C 7/10*    (2006.01)

(52) U.S. Cl.
USPC .............................................. 338/20; 338/21

(58) Field of Classification Search ..................... 338/20, 338/21
See application file for complete search history.

(56) References Cited

U.S. PATENT DOCUMENTS

| | | | |
|---|---|---|---|
| 6,529,361 | B1 * | 3/2003 | Petschel et al. ............... 361/120 |
| 7,570,473 | B2 * | 8/2009 | Adachi et al. .................. 361/120 |
| 8,238,069 | B2 * | 8/2012 | Adachi et al. ................... 361/56 |
| 2008/0079533 | A1 | 4/2008 | Liu et al. |
| 2010/0309595 | A1 | 12/2010 | Adachi et al. |

FOREIGN PATENT DOCUMENTS

| | | |
|---|---|---|
| JP | 2008-085284 A | 4/2008 |
| JP | 2009-152348 A | 7/2009 |
| WO | 2009/098944 A1 | 8/2009 |

OTHER PUBLICATIONS

Machine translation of WO 2009/098944.*
Official Communication issued in International Patent Application No. PCT/JP2010/066905, mailed on Dec. 28, 2010.
Sumi et al., "ESD Protection Device and Manufacturing Method Thereof," U.S. Appl. No. 13/367,399, filed Feb. 7, 2012.

* cited by examiner

*Primary Examiner* — Kyung Lee
(74) *Attorney, Agent, or Firm* — Keating & Bennett, LLP

(57) ABSTRACT

An ESD protection device includes opposed electrodes in a ceramic base material and a discharge auxiliary electrode in contact with each of the opposed electrodes which is arranged so as to provide a bridge from the opposed electrode on one side to the opposed electrode on the other side, the discharge auxiliary electrode includes metallic particles, semiconductor particles, and a vitreous material, and bonding is provided through the vitreous material between the metallic particles, between the semiconductor particles, and between the metallic particles and the semiconductor particles. The metallic particles have an average particle diameter X of about 1.0 μm or more, and the relationship between the thickness Y of the discharge auxiliary electrode and the average particle diameter X of the metallic particles satisfies about $0.5 \leq Y/X \leq$ about 3.

7 Claims, 2 Drawing Sheets

ESD PROTECTION DEVICE AND MANUFACTURING METHOD THEREFOR

BACKGROUND OF THE INVENTION

1. Field of the Invention

The present invention relates to an ESD protection device to protect a semiconductor device, etc. from electrostatic discharge (ESD) failures, and a method for manufacturing such an ESD protection device.

2. Description of the Related Art

In recent years, for the use of commercial-off-the-shelf appliances, there has been a tendency to increase the frequency of inserting and removing cables as input-output interfaces, and consequently, static electricity is likely to be applied to input-output connector areas. In addition, miniaturization in design with an increase in signal frequency has made it difficult to create paths, and LSI itself has been highly sensitive to static electricity.

Therefore, ESD protection devices have been used widely for protecting semiconductor devices such as LSI from electrostatic discharge (ESD).

As this type of ESD protection device, an overvoltage protection element has been proposed which is connected between a first electrode and a second electrode, and includes a porous structure formed by carrying out a firing treatment with the use of an overvoltage protection element material including a non-conductive powder (silicon carbide powder), a metallic conductor powder (Cu powder), and an adhesive (glass).

However, in the case of this overvoltage protection element, the addition of the adhesive (glass) is essential, and there is thus a possibility that the following problems will be caused.

There is a tendency for variation in product characteristics to be increased due to defective dispersion of the glass, and it is difficult to provide high-reliability products.

There is also a tendency for short circuit resistance to be degraded when ESD is applied repeatedly, due to defective dispersion of the glass.

SUMMARY OF THE INVENTION

In view of the circumstances described above, preferred embodiments of the present invention provide an ESD protection device which has stable characteristics, and undergoes no characteristic degradation even when static electricity is applied repeatedly, and a method for manufacturing such an ESD protection device.

An ESD protection device according to a preferred embodiment of the present invention includes opposed electrodes including an opposed electrode on one side and an opposed electrode on the other sides, the opposed electrodes including portions opposed at a distance to each other in a ceramic base material; and a discharge auxiliary electrode in contact with each of the opposed electrode on one side and the opposed electrode on the other side to define the opposed electrodes, the discharge auxiliary electrode being arranged so as to provide a bridge from the opposed electrode on one side to the opposed electrode on the other side, wherein the discharge auxiliary electrode includes metallic particles, semiconductor particles, and a vitreous material, and bonding is provided through the vitreous material between the metallic particles, between the semiconductor particles, and between the metallic particles and the semiconductor particles, furthermore, the metallic particles have an average particle diameter X of about 1.0 µm or more, and the relationship between the thickness Y of the discharge auxiliary electrode and the average particle diameter X of the metallic particles satisfies $0.5 \leq Y/X \leq 3$.

The metallic particles are preferably Cu particles, and the semiconductor particles are preferably silicon carbide particles, for example.

In addition, the vitreous material is preferably produced by a reaction between the metallic particles and the semiconductor particles.

In addition, it is preferable that a cavity section provided in the ceramic base material face a discharge gap section where the opposed electrode on one side and the opposed electrode on the other side, which constitute the opposed electrodes, have portions opposed to each other, and a region of the discharge auxiliary electrode located on the discharge gap section.

In addition, a method for manufacturing an ESD protection device according to a preferred embodiment of the present invention includes the steps of printing, on one principal surface of a first ceramic green sheet, a discharge auxiliary electrode paste including metallic particles with an average particle diameter of about 1.0 µm or more, semiconductor particles, and an organic vehicle, at least one of the metallic particles and the semiconductor particles including, on surfaces thereof, a network-forming component of glass, and a combination of the metallic particles and the semiconductor particles having a ratio of about 7 volume % to about 25 volume %, thereby forming an unfired discharge auxiliary electrode; printing an opposed electrode paste on one principal surface of the first ceramic green sheet, thereby forming unfired opposed electrodes provided with an opposed electrode on one side and an opposed electrode on the other side, the opposed electrodes each partially covering the discharge auxiliary electrode, and the opposed electrodes being arranged with a distance therebetween; stacking a second ceramic green sheet on one principal surface of the first ceramic green sheet, thereby forming an unfired laminated body; and firing the laminated body to react surfaces of the metallic particles of the discharge auxiliary electrode with surfaces of the semiconductor particles, thereby producing a vitreous material.

In addition, the metallic particles included in the discharge auxiliary electrode preferably are alumina-coated Cu particles, and the semiconductor particles preferably are silicon carbide particles, for example.

The ESD protection device according to a preferred embodiment of the present invention includes opposed electrodes including an opposed electrode on one side and an opposed electrode on the other side, the opposed electrodes opposed to each other; and a discharge auxiliary electrode in contact with the opposed electrode on one side and the opposed electrode on the other side, the discharge auxiliary electrode being arranged so as to provide a bridge from the opposed electrode on one side to the opposed electrode on the other side, wherein the discharge auxiliary electrode includes at least metallic particles, semiconductor particles, and a vitreous material, and bonding is provided through the vitreous material between the metallic particles, between the semiconductor particles, and between the metallic particles and the semiconductor particles, furthermore, the metallic particles have an average particle diameter X of about 1.0 µm or more, and the relationship between the thickness Y of the discharge auxiliary electrode and the average particle diameter X of the metallic particles preferably satisfies $0.5 \leq Y/X \leq 3$. Thus, a preferred embodiment of the present invention provides an ESD protection device that has stable characteristics, and undergoes no characteristic degradation even when static electricity is applied repeatedly.

It is to be noted that the bonding provided through the vitreous material between the metallic particles, between the semiconductor particles, and between the metallic particles and the semiconductor particles in preferred embodiments of the present invention refers to a large concept including (a) the case of the respective particles bonded through the vitreous material filled between the respective particles, (b) the case of the respective particles entirely covered with the vitreous material and bonded through the vitreous material, and (c) the case of, for example, the respective particles bonded through the vitreous material scattered on the surfaces of the respective particles, rather than, the vitreous material covering the respective particles entirely or the vitreous material filled between the respective particles.

In the ESD protection device according to a preferred embodiment of the present invention, the metallic particles are preferably Cu particles. This is because the use of Cu particles as the metallic particles makes it possible to constitute an ESD protection device which is able to lower the discharge starting voltage and the peak voltage.

Furthermore, silicon carbide particles are preferably used as the semiconductor particles. This is because the use of silicon carbide particles as the semiconductor particles makes it possible to lower the clamp voltage.

In addition, in the ESD protection device according to a preferred embodiment of the present invention, when the vitreous material is produced by a reaction between the metallic particles and the semiconductor particles, a discharge auxiliary electrode with the vitreous material dispersed uniformly can be formed efficiently even with certainty, without the need to add any glass component separately to the raw material.

In addition, when the ESD protection device is configured to cause the cavity section provided in the ceramic base material to face the discharge gap section where the opposed electrode on one side and the opposed electrode on the other side, which constitute the opposed electrodes, have portions opposed to each other, and a region of the discharge auxiliary electrode located on the discharge gap section, a discharge phenomenon is also produced in the cavity section during ESD application, thus significantly allowing the discharge capacity to be improved more than in the absence of the cavity section.

Furthermore, the method for manufacturing an ESD protection device according to another preferred embodiment of the present invention includes the steps of printing, on one principal surface of a first ceramic green sheet, a discharge auxiliary electrode paste including metallic particles with an average particle diameter of about 1.0 μm or more, semiconductor particles, and an organic vehicle, at least one of the metallic particles and the semiconductor particles including, on surfaces thereof, a network-forming component of glass, and a combination of the metallic particles and the semiconductor particles having a ratio of about 7 volume % to about 25 volume %, thereby forming an unfired discharge auxiliary electrode; printing an opposed electrode paste, thereby forming unfired opposed electrodes provided with an opposed electrode on one side and an opposed electrode on the other side, the opposed electrodes each partially covering the discharge auxiliary electrode, and the opposed electrodes being arranged with a distance therebetween; stacking a second ceramic green sheet on one principal surface of the first ceramic green sheet, thereby forming an unfired laminated body; and firing the laminated body to react surfaces of the metallic particles of the discharge auxiliary electrode with surfaces of the semiconductor particles, thereby producing a vitreous material. Thus, the method allows an ESD protection device including the structure according to a preferred embodiment of the present invention to be manufactured efficiently even with certainty.

Further, it is also possible to achieve an ESD protection device including external electrodes in such a way that an external electrode paste is printed on the surface of the unfired laminated body so as to be connected to the opposed electrodes, and then subjected to firing before the step of firing the laminated body, and it is also possible to form external electrodes in such a way that an external electrode paste is printed on the surface of the laminated body, and then subjected to firing after firing the laminated body.

It is to be noted that in the method for manufacturing an ESD protection device according to a preferred embodiment of the present invention, the network-forming component of the glass included in the surface of at least one of the metallic particles and the semiconductor particles refers to a component which can be glass even by itself, and can include, for example, $SiO_2$, $B_2O_3$, $Al_2O_3$, $P_2O_5$, $ZrO_2$, $V_2O_5$, $TiO_2$, ZnO, $GeO_2$, $As_2O_5$, $Sb_2O_5$, PbO, and BeO.

In addition, when alumina-coated Cu particles are used as the metallic particles included in the discharge auxiliary electrode, whereas silicon carbide particles are used as a raw material for the semiconductor particles, the alumina ($Al_2O_3$), a minute amount of silicon oxide which will be typically present on the surface of the silicon carbide, etc., can serve as the network-forming component of the glass to provide bonding through the vitreous material between the metallic particles, between the semiconductor particles, or between the metallic particles and the semiconductor particles for constituting the discharge auxiliary electrode, thereby allowing the efficient manufacture of an ESD protection device which has stable characteristics, and undergoes no characteristic degradation even when static electricity is applied repeatedly.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

With reference to preferred embodiments of the present invention, features of the present invention will be described below in more detail.

Figure 1:
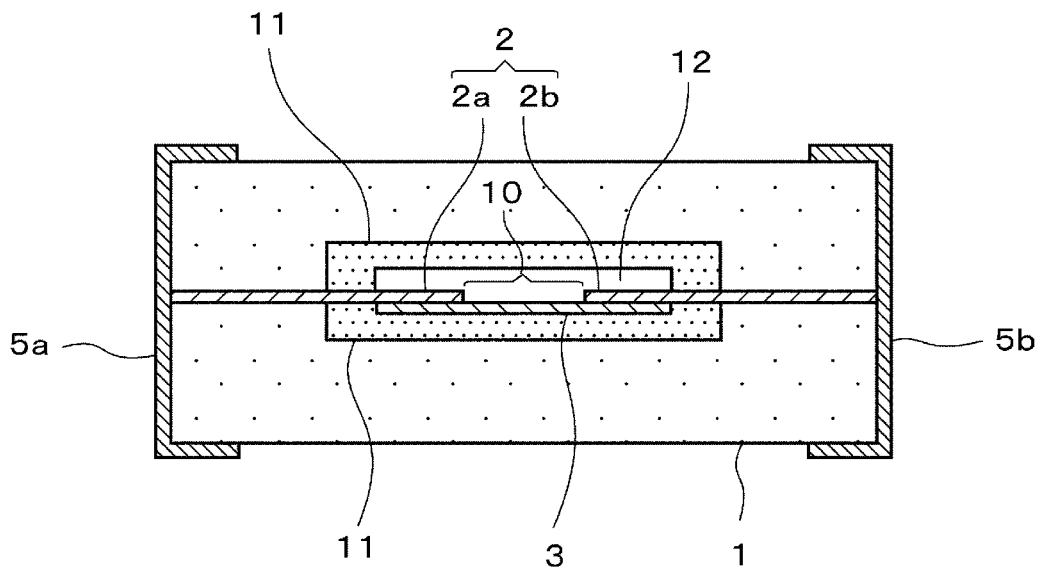
FIG. 1 is a front cross-sectional view schematically illustrating the structure of an ESD protection device according to a preferred embodiment of the present invention.
Figure 2:
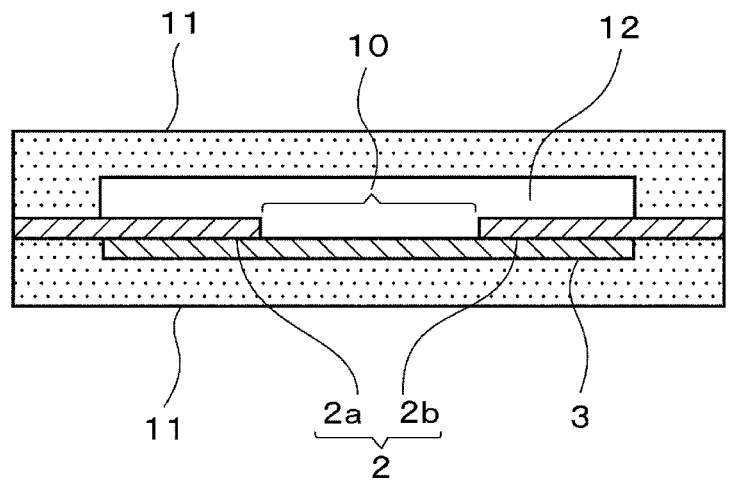
FIG. 2 is an enlarged front cross-sectional view illustrating an enlarged main section of the ESD protection according to a preferred embodiment of the present invention.
Figure 3:
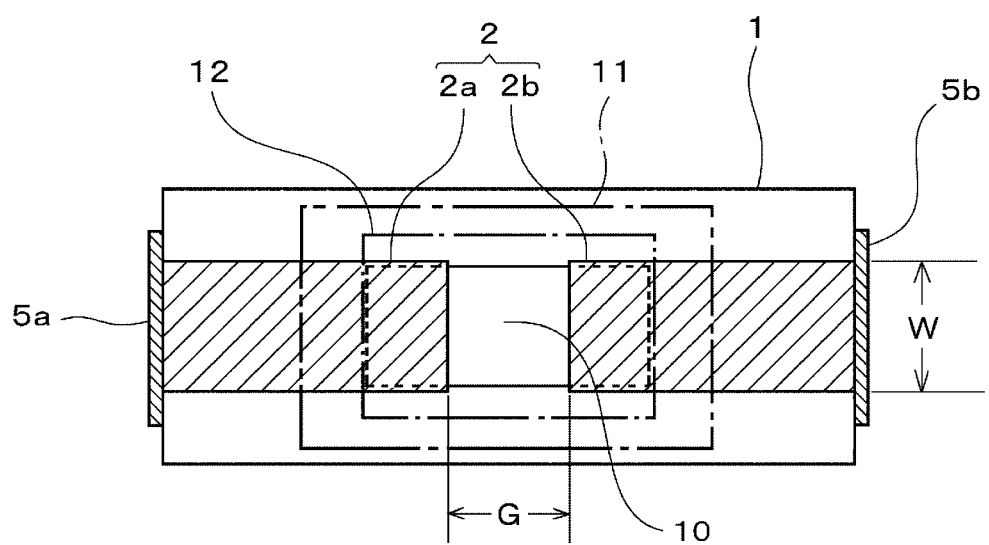
FIG. 3 is a plan view illustrating the internal structure of the ESD protection device according to a preferred embodiment of the present invention.

FIG. 1 is a cross-sectional view schematically illustrating the structure of an ESD protection device according to a preferred embodiment of the present invention, FIG. 2 is an enlarged front cross-sectional view illustrating an enlarged main section of the ESD protection device, and FIG. 3 is a plan cross-sectional view of the ESD protection device according to a preferred embodiment of the present invention.

This ESD protection device includes, as shown in FIGS. 1 to 3, a ceramic base material 1, opposed electrodes (extraction electrodes) 2 including an opposed electrode 2a on one side and an opposed electrode 2b on the other side, which are located in the same plane in the ceramic base material 1, and include ends opposed to each other, a discharge auxiliary electrode 3 in partial contact with the opposed electrode 2a on one side and the opposed electrode 2b on the other side, which is arranged so as to provide a bridge from the opposed electrode 2a on one side to the opposed electrode 2b on the other side, and external electrodes 5a and 5b for external electrical connections, which are placed on both ends of the ceramic base material 1 to provide conduction to the opposed electrode 2a on one side and the opposed electrode 2b on the other side for constituting the opposed electrodes 2.

The discharge auxiliary electrode 3 includes metallic particles, semiconductor particles, and a vitreous material, and has bonding through the vitreous material between the metallic particles, between the semiconductor particles, and between the metallic particles and the semiconductor particles. It is to be noted that the vitreous material is a reaction product caused by a reaction between the metallic particles and the semiconductor particles.

In addition, Cu particles are used as the metallic particles, whereas silicon carbide particles are used as the semiconductor particles.

Furthermore, the ESD protection device according to a preferred embodiment of the present invention is configured so that the relationship between the thickness Y of the discharge auxiliary electrode 3 and the average particle diameter X of the metallic particles satisfies $0.5 \leq Y/X \leq 3$.

In addition, a discharge gap section 10 where the opposed electrode 2a on one side and the opposed electrode 2b on the other side, which constitute the opposed electrodes 2, are opposed to each other, and a region of the discharge auxiliary electrode 3 located on the discharge gap section 10 are arranged so as to face a cavity section 12 provided in the ceramic base material 1. More specifically, in this ESD protection device, the functional section to serve as an ESD protection device, such as the discharge gap section 10 and the discharge auxiliary electrode 3 to connect the opposed electrode 2a on one side and the opposed electrode 2b on the other side, is arranged to face the cavity section 12 in the ceramic base material.

Furthermore, in this ESD protection device, a sealing layer 11 is arranged so as to cover the opposed section (discharge gap section 10) between the opposed electrode 2a on one side and the opposed electrode 2b on the other side, connections between the opposed electrodes 2 and the discharge auxiliary electrode 3, and the region of the discharge auxiliary electrode 3 located on the discharge gap section 10, as well as cavity section 12, etc. This sealing layer 11 is a porous layer including ceramic particles such as alumina, which functions to absorb and keep (trap) the glass component contained in the ceramic base material 1 and the glass component produced in the ceramic base material 1 in a firing step to prevent the ingress of the glass component into the cavity section 12 or the discharge gap section 10 therein. Then, as a result, the sealing layer 11 makes it possible to prevent the glass component from flowing into the discharge auxiliary electrode 3 to progress sintering excessively and thus increase the electrical conductivity of the discharge auxiliary electrode 3, thereby causing a short circuit defect, and prevent the inflow of the glass component into the cavity section to ensure the cavity section, thereby causing a discharge phenomenon to be also produced in the cavity section, and thus allowing a high discharge capacity to be ensured.

In addition, in the ESD protection device according to the example, a glass ceramic substrate which preferably has a rectangular planar shape of, for example, approximately 1.0 mm in length, 0.5 mm in width, and 0.3 mm in thickness and contains, as its main constituent, an oxide of Ba, Al, and Si is used as the ceramic base material 1, for example.

However, the constituent material of the ceramic base material 1 has no limitations, and it is also possible to use other types of materials such as an alumina substrate and a silicon substrate in some cases. It is to be noted that it is desirable to use, as the ceramic base material 1, a material with a relative permittivity of about 50 or less, preferably about 10 or less, for example.

A non-limiting example of a method for manufacturing an ESD protection device which has the structure as described above will now be described.

Materials containing Ba, Al, and Si as main constituents are prepared as ceramic materials for the material of the ceramic base material 1.

Then, the respective materials are blended to provide a predetermined composition, and subjected to calcination at 800° C. to 1000° C. The calcined powder obtained is subjected to grinding in a zirconia ball mill for 12 hours to obtain a ceramic powder.

This ceramic powder with an organic solvent such as toluene or ekinen added is mixed, followed by the further addition and mixing of a binder and a plasticizer, thereby preparing a slurry.

This slurry is subjected to shape forming by a doctor blade method, thereby preparing a ceramic green sheet with a thickness of 50 μm.

In addition, as an opposed electrode paste for forming the pair of opposed electrodes 2a and 2b, a binder resin including an 80 weight % of a Cu powder with an average particle size of approximately 2 μm, ethyl cellulose, etc. is prepared, and agitated and mixed with the use of a three roll mill with the addition of a solvent to prepare an opposed electrode paste. It is to be noted that the average particle size of the Cu powder mentioned above refers to a median particle size (D50) obtained from particle size distribution measurement by Microtrack.

Furthermore, as a discharge auxiliary electrode paste for forming the discharge auxiliary electrode 3, metallic particles (metallic conductor powder) and semiconductor particles (semiconductor powder) were blended in a predetermined ratio, and with the addition of a vehicle, agitated and mixed with the use of three rolls to prepare a discharge auxiliary electrode paste.

It is to be noted that the discharge auxiliary electrode paste was adjusted to provide a volume fraction of 75 vol % to 95 vol % for the vehicle and provide the other volume fraction of 5 vol % to 25 vol % for the metallic particles and the semiconductor particles.

Further, the type of the metallic particles (metallic conductor powder) used for evaluation is shown in Table 1.

The amount (weight %) of $Al_2O_3$ coating and amount (weight %) of $ZrO_2$ coating in Table 1 refer to the ratios by weight of the coating types of the total coated Cu particles, and the balance is the metallic particles (metallic conductor powder).

Furthermore, the type of the semiconductor particles (semiconductor powder) used for evaluation is shown in Table 2. In addition, Table 2 additionally shows the type of the insulator particles (insulator powder) used for comparative evaluation.

Furthermore, Table 3 shows the composition of the vehicle, more specifically, the type of a binder, the type of a solvent, the type of a dispersant, and the blend ratio thereof.

In addition, Tables 4 and 5 show the compositions (vol %) of discharge auxiliary electrode pastes prepared with the use of the metallic particles and the semiconductor particles, the insulator particles, and the vehicle.

TABLE 1

| Sample Number | Type of Metallic Particle | Cu Average Particle Diameter (μm) | Amount of Al$_2$O$_3$ Coating (wt %) | Amount of ZrO$_2$ Coating (wt %) |
|---|---|---|---|---|
| M1  | Cu | 0.15 | — | — |
| M2  | Cu | 0.35 | — | — |
| M3  | Cu | 0.55 | — | — |
| M4  | Cu | 1.10 | — | — |
| M5  | Cu | 3.10 | — | — |
| M6  | Cu | 6.10 | — | — |
| M7  | Cu | 3.10 | 1.0 | — |
| M8  | Cu | 3.10 | 3.0 | — |
| M9  | Cu | 3.10 | 5.0 | — |
| M10 | Cu | 3.10 | 7.0 | — |
| M11 | Cu | 3.10 | — | 1.0 |
| M12 | Cu | 3.10 | — | 3.0 |
| M13 | Cu | 3.10 | — | 5.0 |
| M14 | Cu | 3.10 | — | 7.0 |

TABLE 2

| Sample Number | Type of Semiconductor Particle | Type of Insulator Particle | Particle Size distribution D50 (μm) |
|---|---|---|---|
| S1 | SiC | — | 0.1 |
| S2 | SiC | — | 0.3 |
| S3 | SiC | — | 0.5 |
| S4 | — | Al$_2$O$_3$ | 0.1 |
| S5 | — | Al$_2$O$_3$ | 0.3 |
| S6 | — | Al$_2$O$_3$ | 0.5 |

TABLE 3

| Sample Number | Type of Binder Resin (vol %) Ethocel Resin | Type of Binder Resin (vol %) Alkyd Resin | Type of Solvent (vol %) Dihydroterpineol | Type of Dispersant (vol %) Alkylamine Salt of Polyunsaturated Fatty Acid |
|---|---|---|---|---|
| B1 | 6.06 | 3.54 | 88.14 | 2.26 |

TABLE 4

| Paste | M1 | M2 | M3 | M4 | M5 | M6 | M7 | M8 | M9 | M10 | M11 | M12 | M13 | M14 | S1 | S2 | S3 | S4 | S5 | S6 | B1 | Solid Content Concentration (vol %) |
|---|---|---|---|---|---|---|---|---|---|---|---|---|---|---|---|---|---|---|---|---|---|---|
| P1  | 5.6  | —    | —    | —    | — | — | — | — | — | — | — | — | — | — | 1.4 | —   | — | — | — | — | 93 | 7  |
| P2  | 8.0  | —    | —    | —    | — | — | — | — | — | — | — | — | — | — | 2.0 | —   | — | — | — | — | 90 | 10 |
| P3  | 11.2 | —    | —    | —    | — | — | — | — | — | — | — | — | — | — | 2.8 | —   | — | — | — | — | 86 | 14 |
| P4  | —    | 5.6  | —    | —    | — | — | — | — | — | — | — | — | — | — | 1.4 | —   | — | — | — | — | 93 | 7  |
| P5  | —    | 8.0  | —    | —    | — | — | — | — | — | — | — | — | — | — | 2.0 | —   | — | — | — | — | 90 | 10 |
| P6  | —    | 11.2 | —    | —    | — | — | — | — | — | — | — | — | — | — | 2.8 | —   | — | — | — | — | 86 | 14 |
| P7  | —    | —    | 4.0  | —    | — | — | — | — | — | — | — | — | — | — | 1.0 | —   | — | — | — | — | 95 | 5  |
| P8  | —    | —    | 5.6  | —    | — | — | — | — | — | — | — | — | — | — | 1.4 | —   | — | — | — | — | 93 | 7  |
| P9  | —    | —    | 8.0  | —    | — | — | — | — | — | — | — | — | — | — | 2.0 | —   | — | — | — | — | 90 | 10 |
| P10 | —    | —    | 11.2 | —    | — | — | — | — | — | — | — | — | — | — | 2.8 | —   | — | — | — | — | 86 | 14 |
| P11 | —    | —    | —    | 4.0  | — | — | — | — | — | — | — | — | — | — | 1.0 | —   | — | — | — | — | 95 | 5  |
| P12 | —    | —    | —    | 5.6  | — | — | — | — | — | — | — | — | — | — | 1.4 | —   | — | — | — | — | 93 | 7  |
| P13 | —    | —    | —    | 8.0  | — | — | — | — | — | — | — | — | — | — | 2.0 | —   | — | — | — | — | 90 | 10 |
| P14 | —    | —    | —    | 11.2 | — | — | — | — | — | — | — | — | — | — | 2.8 | —   | — | — | — | — | 86 | 14 |
| P15 | —    | —    | —    | 16.0 | — | — | — | — | — | — | — | — | — | — | 4.0 | —   | — | — | — | — | 80 | 20 |
| P16 | —    | —    | —    | 4.0  | — | — | — | — | — | — | — | — | — | — | —   | 1.0 | — | — | — | — | 95 | 5  |
| P17 | —    | —    | —    | 5.6  | — | — | — | — | — | — | — | — | — | — | —   | 1.4 | — | — | — | — | 93 | 7  |
| P18 | —    | —    | —    | 8.0  | — | — | — | — | — | — | — | — | — | — | —   | 2.0 | — | — | — | — | 90 | 10 |
| P19 | —    | —    | —    | 11.2 | — | — | — | — | — | — | — | — | — | — | —   | 2.8 | — | — | — | — | 86 | 14 |
| P20 | —    | —    | —    | 16.0 | — | — | — | — | — | — | — | — | — | — | —   | 4.0 | — | — | — | — | 80 | 20 |
| P21 | —    | —    | —    | 4.0  | — | — | — | — | — | — | — | — | — | — | —   | —   | 1.0 | — | — | — | 95 | 5  |
| P22 | —    | —    | —    | 8.0  | — | — | — | — | — | — | — | — | — | — | —   | —   | 2.0 | — | — | — | 90 | 10 |
| P23 | —    | —    | —    | 11.2 | — | — | — | — | — | — | — | — | — | — | —   | —   | 2.8 | — | — | — | 86 | 14 |
| P24 | —    | —    | —    | 16.0 | — | — | — | — | — | — | — | — | — | — | —   | —   | 4.0 | — | — | — | 80 | 20 |
| P25 | —    | —    | —    | —    | 5.6 | — | — | — | — | — | — | — | — | — | 1.4 | —   | — | — | — | — | 93 | 7  |

TABLE 5

| Paste | Type of Metallic Particle (vol %) | | | | | | | | | | | | | | Type of Semiconductor Particle (vol %) | | | | | | Vehicle (vol %) | Solid Content Concentration (vol %) |
|---|---|---|---|---|---|---|---|---|---|---|---|---|---|---|---|---|---|---|---|---|---|---|
| | M1 | M2 | M3 | M4 | M5 | M6 | M7 | M8 | M9 | M10 | M11 | M12 | M13 | M14 | S1 | S2 | S3 | S4 | S5 | S6 | B1 | |
| P26 | — | — | — | — | 8.0 | — | — | — | — | — | — | — | — | — | 2.0 | — | — | — | — | — | 90 | 10 |
| P27 | — | — | — | — | 11.2 | — | — | — | — | — | — | — | — | — | 2.8 | — | — | — | — | — | 86 | 14 |
| P28 | — | — | — | — | 16.0 | — | — | — | — | — | — | — | — | — | 4.0 | — | — | — | — | — | 80 | 20 |
| P29 | — | — | — | — | 4.0 | — | — | — | — | — | — | — | — | — | 1.0 | — | — | — | — | — | 95 | 5 |
| P30 | — | — | — | — | 8.0 | — | — | — | — | — | — | — | — | — | — | — | 2.0 | — | — | — | 90 | 10 |
| P31 | — | — | — | — | 11.2 | — | — | — | — | — | — | — | — | — | — | — | 2.8 | — | — | — | 86 | 14 |
| P32 | — | — | — | — | 16.0 | — | — | — | — | — | — | — | — | — | — | — | 4.0 | — | — | — | 80 | 20 |
| P33 | — | — | — | — | 29.6 | — | — | — | — | — | — | — | — | — | — | — | 7.4 | — | — | — | 63 | 37 |
| P34 | — | — | — | — | — | 4.0 | — | — | — | — | — | — | — | — | 1.0 | — | — | — | — | — | 95 | 5 |
| P35 | — | — | — | — | — | 11.2 | — | — | — | — | — | — | — | — | 2.8 | — | — | — | — | — | 86 | 14 |
| P36 | — | — | — | — | — | 16.0 | — | — | — | — | — | — | — | — | 4.0 | — | — | — | — | — | 80 | 20 |
| P37 | — | — | — | — | — | 20.0 | — | — | — | — | — | — | — | — | 5.0 | — | — | — | — | — | 75 | 25 |
| P38 | — | — | — | — | — | 4.0 | — | — | — | — | — | — | — | — | 1.0 | — | — | — | — | — | 95 | 5 |
| P39 | — | — | — | — | — | 11.2 | — | — | — | — | — | — | — | — | — | — | 2.8 | — | — | — | 86 | 14 |
| P40 | — | — | — | — | — | 16.0 | — | — | — | — | — | — | — | — | — | — | 4.0 | — | — | — | 80 | 20 |
| P41 | — | — | — | — | — | 20.0 | — | — | — | — | — | — | — | — | — | — | 5.0 | — | — | — | 75 | 25 |
| P42 | — | — | — | — | — | — | 11.2 | — | — | — | — | — | — | — | — | — | 2.8 | — | — | — | 86 | 14 |
| P43 | — | — | — | — | — | — | — | 11.2 | — | — | — | — | — | — | — | — | 2.8 | — | — | — | 86 | 14 |
| P44 | — | — | — | — | — | — | — | — | 11.2 | — | — | — | — | — | — | — | 2.8 | — | — | — | 86 | 14 |
| P45 | — | — | — | — | — | — | — | — | — | 11.2 | — | — | — | — | — | — | 2.8 | — | — | — | 86 | 14 |
| P46 | — | — | — | — | — | — | — | — | — | — | 11.2 | — | — | — | — | — | 2.8 | — | — | — | 86 | 14 |
| P47 | — | — | — | — | — | — | — | — | — | — | — | 11.2 | — | — | — | — | 2.8 | — | — | — | 86 | 14 |
| P48 | — | — | — | — | — | — | — | — | — | — | — | — | 11.2 | — | — | — | 2.8 | — | — | — | 86 | 14 |
| P49 | — | — | — | — | — | — | — | — | — | — | — | — | — | 11.2 | — | — | 2.8 | — | — | — | 86 | 14 |
| P50 | — | — | — | — | — | — | 11.2 | — | — | — | — | — | — | — | — | — | — | 2.8 | — | — | 86 | 14 |
| P51 | — | — | — | — | — | — | 11.2 | — | — | — | — | — | — | — | — | — | — | — | 2.8 | — | 86 | 14 |
| P52 | — | — | — | — | — | — | 11.2 | — | — | — | — | — | — | — | — | — | — | — | — | 2.8 | 86 | 14 |

As a paste for forming the sealing layer described above, a sealing layer paste including alumina and an organic vehicle was prepared.

As a paste for forming the cavity section 12 described above, a resin paste decomposed and burned to disappear in a firing step was prepared, such as a resin, an organic solvent, and an organic binder.

The above-described discharge auxiliary electrode paste, opposed electrode paste, sealing layer paste, and resin paste for the formation of the cavity section are printed on a first ceramic green sheet.

Specifically, first, the sealing layer paste is applied onto the first ceramic green sheet.

Then, the discharge auxiliary electrode paste is printed on the sealing layer paste by a screen printing method so as to provide a predetermined pattern, and subjected to drying, thereby forming an unfired discharge auxiliary electrode. According to a preferred embodiment of the present invention, the obtained ESD protection device herein is preferably configured so that the metallic particles constituting the discharge auxiliary electrode have an average particle diameter X of about 1.0 µm or more, and the relationship between the thickness Y of the discharge auxiliary electrode and the average particle diameter X of the metallic particles satisfies $0.5 \leq Y/X \leq 3$.

Furthermore, the opposed electrode paste is applied to form an unfired opposed electrode on one side and an unfired opposed electrode on the other side, for constituting the opposed electrodes. Thus, a discharge gap 10 is formed between the ends of the opposed electrode 2a on one side and the opposed electrode 2b on the other side, which are opposed to each other.

It is to be noted that the width W (FIG. 3) of the opposed electrode 2a on one side and the opposed electrode 2b on the other side for constituting the opposed electrodes 2 and the dimension G (FIG. 3) of the discharge gap 10 were respectively adjusted to be about 100 µm and about 30 µm at the stage after firing in this example.

Then, the resin paste for the formation of the cavity section is applied to a region in which the cavity section 12 is to be formed, over the opposed electrodes 2 and the discharge auxiliary electrode 3.

Further, the sealing layer paste is applied from above so as to cover the resin paste for the formation of the cavity section, thereby forming an unfired sealing layer.

A second ceramic green sheet with no paste applied thereto is stacked on the first ceramic green sheet with the respective pastes applied thereto in the order of the sealing layer paste, the discharge auxiliary electrode paste, the opposed electrode paste, the resin paste, and the sealing layer paste in the way described above, and subjected to pressure bonding. In this case, a laminated body was formed so as to have a thickness of about 0.3 mm after firing.

The laminated body is cut by a microcutter to be divided into respective chips. In this case, the cutting was carried out so as to provide a length of about 1.0 mm and a width of about 0.5 mm after firing. After that, the external electrode paste was applied onto the end surfaces to form unfired external electrodes.

Then, the chips with the external electrode paste applied thereto are subjected to firing in an $N_2$ atmosphere.

It is to be noted that in the case of introducing a rare gas such as Ar or Ne into the cavity section 12 in order to lower the voltage of response to ESD, a firing step in a temperature range in which the ceramic material undergoes shrinkage and sintering may be carried out in a rare gas atmosphere such as Ar or Ne. In the case of using an electrode material which is not oxidized, it is also possible to carry out the firing in the atmosphere.

Plating is carried out by electrolytic plating in the order of Ni plating and Sn plating onto the external electrodes formed in the firing step. This plating forms external electrodes which include a Ni plating film and a Sn plating film and have excellent properties such as solderability.

Thus, an ESD protection device is obtained which has the structure as shown in FIGS. 1 to 3.

Next, the ESD protection devices prepared in the way described above were examined for their respective characteristics by the following methods.

The short circuit resistance was evaluated by checking the IR after applying 8 kV 50 times, applying 4 kV 10 times, applying 2 kV 10 times, applying 1 kV 10 times, applying 0.5 kV 10 times, and applying 0.2 kV 10 times in contact discharge.

The device with IR less than $10^6 \Omega$ was determined as a device with defective short circuit resistance (× mark) in the ESD application, whereas the device with IR of $10^6 \Omega$ or more was determined as a device with good short circuit resistance (○ mark).

For conducting the evaluation of ESD discharge responsivity (ESD repetition resistance) as responsivity to repeated ESD, first, the electrostatic discharge immunity test provided in the IEC standard, IEC 61000-4-2, was carried out for 100 samples respectively to obtain the average value. Then, for each sample, the electrostatic discharge immunity test was carried out after applying 8 kV 50 times, applying 4 kV 10 times, applying 2 kV 10 times, applying 1 kV 10 times, applying 0.5 kV 10 times, and applying 0.2 kV 10 times in contact discharge as in the case of (1), to check the ESD discharge responsivity (ESD repetition resistance).

In the electrostatic discharge immunity test after applying static electricity repeatedly, the sample with a peak voltage detected on the protection circuit side greater than 900 V was determined as a sample with defective ESD discharge responsivity (× mark), whereas the sample with the peak voltage of 900 V or less was determined as a sample with good ESD discharge responsivity (○ mark).

It is to be noted that ten of the laminated bodies after the firing were cut in the stacking direction at the point of W=½ for the opposed electrodes to expose the discharge auxiliary electrodes, and the sections of the discharge auxiliary electrodes were polished. Next, the discharge auxiliary electrodes exposed at the sections were observed with the use of a metallography, the equivalent circle diameters of the observed individual metallic particles were subjected to length measurement with the use of image processing software, and the average value was determined as the average particle diameter X for the metallic particles constituting the discharge auxiliary electrode. In addition, the thicknesses of the individual discharge auxiliary electrodes were subjected to length measurement with the use of image processing software in the same way, and the average value was determined as the thickness Y of the discharge auxiliary electrode. Then, from the values of the average particle diameter X and of the thickness Y of the discharge auxiliary electrode, the relation X/Y between the both values was obtained.

The good sample in terms of both of the two characteristic evaluation results of the short circuit resistance and ESD discharge responsivity was evaluated as a good sample in terms of comprehensive determination (○ mark), whereas the defective sample in terms of either one or both of the two characteristic evaluation results was evaluated as a defective sample in terms of comprehensive determination (× mark).

Tables 6 and 7 show the conditions for the discharge auxiliary electrode paste, the relationship between the average particle diameter X and the thickness Y of the discharge auxiliary electrode, the result of the characteristic evaluations, etc.

In Tables 6 and 7, the samples of sample numbers with a symbol of * refer to samples which fail to meet the requirements or characteristics of preferred embodiments of the present invention.

TABLE 6

| Sample Number | Paste | X μm | Y μm | Y/X | Short Circuit Resistance | ESD Discharge Responsivity | Comprehensive Determination |
|---|---|---|---|---|---|---|---|
| *1 | P1 | 0.10 | 0.30 | 3.00 | x | x | x |
| *2 | P2 | 0.10 | 0.50 | 5.00 | x | x | x |
| *3 | P3 | 0.10 | 1.00 | 10.00 | x | x | x |
| *4 | P4 | 0.30 | 0.30 | 1.00 | x | x | x |
| *5 | P5 | 0.30 | 0.50 | 1.67 | x | x | x |
| *6 | P6 | 0.30 | 1.50 | 5.00 | x | x | x |
| *7 | P7 | 0.50 | 0.20 | 0.40 | x | x | x |
| *8 | P8 | 0.50 | 0.30 | 0.60 | x | x | x |
| *9 | P9 | 0.50 | 0.50 | 1.00 | x | x | x |
| *10 | P10 | 0.50 | 1.50 | 3.00 | x | x | x |
| *11 | P11 | 1.00 | 0.40 | 0.40 | x | x | x |
| 12 | P12 | 1.00 | 0.60 | 0.60 | ○ | ○ | ○ |
| 13 | P13 | 1.00 | 1.00 | 1.00 | ○ | ○ | ○ |
| 14 | P14 | 1.00 | 2.00 | 2.00 | ○ | ○ | ○ |
| 15 | P15 | 1.00 | 3.00 | 3.00 | ○ | ○ | ○ |
| *16 | P16 | 1.00 | 0.40 | 0.40 | x | x | x |
| 17 | P17 | 1.00 | 0.60 | 0.60 | ○ | ○ | ○ |
| 18 | P18 | 1.00 | 1.00 | 1.00 | ○ | ○ | ○ |
| 19 | P19 | 1.00 | 2.00 | 2.00 | ○ | ○ | ○ |
| 20 | P20 | 1.00 | 3.00 | 3.00 | ○ | ○ | ○ |
| *21 | P21 | 1.00 | 0.40 | 0.40 | x | x | x |
| 22 | P22 | 1.00 | 1.00 | 1.00 | ○ | ○ | ○ |
| 23 | P23 | 1.00 | 2.00 | 2.00 | ○ | ○ | ○ |
| 24 | P24 | 1.00 | 3.00 | 3.00 | ○ | ○ | ○ |
| *25 | P25 | 3.00 | 0.70 | 0.23 | x | x | x |

TABLE 7

| Sample Number | Paste | X μm | Y μm | Y/X | Short Circuit Resistance | ESD Discharge Responsivity | Comprehensive Determination |
|---|---|---|---|---|---|---|---|
| 26 | P26 | 3.00 | 1.50 | 0.50 | ○ | ○ | ○ |
| 27 | P27 | 3.00 | 3.00 | 1.00 | ○ | ○ | ○ |
| 28 | P28 | 3.00 | 5.00 | 1.67 | ○ | ○ | ○ |
| *29 | P29 | 3.00 | 0.70 | 0.23 | x | x | x |
| 30 | P30 | 3.00 | 1.50 | 0.50 | ○ | ○ | ○ |
| 31 | P31 | 3.00 | 3.00 | 1.00 | ○ | ○ | ○ |
| 32 | P32 | 3.00 | 5.00 | 1.67 | ○ | ○ | ○ |
| *33 | P33 | 3.00 | 12.00 | 4.00 | x | x | x |
| *34 | P34 | 6.00 | 1.00 | 0.17 | x | x | x |
| 35 | P35 | 6.00 | 3.50 | 0.58 | ○ | ○ | ○ |
| 36 | P36 | 6.00 | 5.50 | 0.92 | ○ | ○ | ○ |
| 37 | P37 | 6.00 | 7.00 | 1.17 | ○ | ○ | ○ |
| *38 | P38 | 6.00 | 1.00 | 0.17 | x | x | x |
| 39 | P39 | 6.00 | 3.50 | 0.58 | ○ | ○ | ○ |
| 40 | P40 | 6.00 | 5.50 | 0.92 | ○ | ○ | ○ |
| 41 | P41 | 6.00 | 7.00 | 1.17 | ○ | ○ | ○ |
| 42 | P42 | 3.00 | 3.00 | 1.00 | ○ | ○ | ○ |
| 43 | P43 | 3.00 | 3.00 | 1.00 | ○ | ○ | ○ |
| 44 | P44 | 3.00 | 3.00 | 1.00 | ○ | ○ | ○ |
| 45 | P45 | 3.00 | 3.00 | 1.00 | ○ | ○ | ○ |
| 46 | P46 | 3.00 | 3.00 | 1.00 | ○ | ○ | ○ |
| 47 | P47 | 3.00 | 3.00 | 1.00 | ○ | ○ | ○ |
| 48 | P48 | 3.00 | 3.00 | 1.00 | ○ | ○ | ○ |
| 49 | P49 | 3.00 | 3.00 | 1.00 | ○ | ○ | ○ |
| *50 | P50 | 3.00 | 3.00 | 1.00 | x | ○ | x |
| *51 | P51 | 3.00 | 3.00 | 1.00 | x | ○ | x |
| *52 | P52 | 3.00 | 3.00 | 1.00 | x | ○ | x |

From Tables 6 and 7, it has been confirmed that the short circuit resistance and the ESD discharge responsivity are degraded by the repeated ESD application in the case of the ESD protection devices of sample numbers 1 to 10 which fail to meet the requirements or characteristics of preferred embodiments of the present invention on the ground that the average particle diameter X of the metallic particles included in the discharge auxiliary electrode is less than about 1.0 μm.

In addition, it has been confirmed that the short circuit resistance is degraded in the case of the ESD protection devices of sample numbers 11, 16, 21, 25, 29, 33, 34, and 38 which fail to meet the requirements or characteristics of preferred embodiments of the present invention on the ground that the relationship between the thickness Y of the discharge auxiliary electrode and the average particle diameter X of the metal is $0.5 > Y/X$.

On the other hand, the short circuit resistance was favorable, and the ESD discharge responsivity was favorable, in the case of the ESD protection devices of sample numbers 12 to 15, 17 to 20, 22 to 24, 26 to 28, 30 to 32, 35 to 37, and 39 to 49 which meet the requirements or characteristics of preferred embodiments of the present invention on the grounds that the average particle diameter X of the metallic particles included in the discharge auxiliary electrode is about 1.0 μm or more, and the relationship between the thickness Y of the discharge auxiliary electrode and the average particle diameter diameter X of the metal satisfies $0.5 \leq Y/X \leq 3$.

In addition, it has been confirmed that the short circuit resistance is degraded in the case of the ESD protection devices of sample numbers 50 to 52 using the insulator particles $Al_2O_3$ in place of the semiconductor particles SiC.

This is believed to be due to the locally increased density of Cu in the discharge auxiliary electrode. More specifically, this is presumed to be because fine $Al_2O_3$ present locally in the discharge auxiliary electrode forms an excessive liquid phase component, thereby locally resulting in excessively sintered Cu particles.

From the results in the examples described above, it has been confirmed that when the metallic particles constituting the discharge auxiliary electrode have an average particle diameter X of about 1.0 μm or more, and when the relationship between the thickness Y of the discharge auxiliary electrode and the average particle diameter X of the metallic particles satisfies $0.5 \leq Y/X \leq 3$, (a) the short circuit resistance is good in the repeated ESD application, and (b) the surfaces of the metallic particles and semiconductor particles constituting the discharge auxiliary electrode react with each other to produce the vitreous material in the firing step even without the addition of glass, and form the discharge auxiliary electrode in which bonding is provided through the vitreous material between the metallic particles, between the semiconductor particles, and between the metallic particles and the semiconductor particles, thus keeping the short circuit resistance good even when static electricity is applied repeatedly.

While the explanation has been given in the preferred embodiments described above with the use of the ESD protection device including the sealing layer and the cavity section as an example, the present invention is also able to adopt a structure including either one of the sealing layer and the cavity section and a structure including neither the sealing layer nor the cavity section.

It is to be noted that the present invention is not to be considered limited to the preferred embodiments described above, and it is possible to find various applications of and make various modifications to the constituent material and specific shape of the opposed electrodes, the specific shape of the discharge auxiliary electrode, the metallic particles constituting the discharge auxiliary electrode, the type of the semiconductor particles, the type of the vitreous material which serves as bonding between the metallic particles, between the semiconductor particles, and between the metallic particles and the semiconductor particles, and the methods for forming the sealing layer and the cavity section, etc.

As described above, preferred embodiments of the present invention allow an ESD protection device to be provided which has stable characteristics, and undergoes no characteristic degradation even when static electricity is applied repeatedly. Therefore, it is possible to apply preferred embodiments of the present invention widely in the field of ESD protection devices used for the protection of various appliances and devices including semiconductor devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection device comprising:
    opposed electrodes including an opposed electrode on a first side and an opposed electrode on a second side, the opposed electrodes including portions opposed at a distance to each other in a ceramic base material; and
    a discharge auxiliary electrode in contact with each of the opposed electrode on the first side and the opposed electrode on the second side, the discharge auxiliary electrode being arranged to provide a bridge from the opposed electrode on the first side to the opposed electrode on the second side; wherein
    the discharge auxiliary electrode includes metallic particles, semiconductor particles, and a vitreous material, and bonds are provided through the vitreous material between the metallic particles, between the semiconductor particles, and between the metallic particles and the semiconductor particles, the metallic particles have an average particle diameter X of about 1.0 μm or more, and a relationship between a thickness Y of the discharge auxiliary electrode and an average particle diameter X of the metallic particles satisfies about $0.5 \leq Y/X \leq$ about 3.

2. The ESD protection device according to claim 1, wherein the metallic particles are Cu particles.

3. The ESD protection device according to claim 1, wherein the semiconductor particles are silicon carbide particles.

4. The ESD protection device according to claim 1, wherein the vitreous material is produced by a reaction between the metallic particles and the semiconductor particles.

5. The ESD protection device according to claim 1, wherein a cavity section provided in the ceramic base material faces a discharge gap section where the opposed electrode on the first side and the opposed electrode on the second side have portions opposed to each other, and a region of the discharge auxiliary electrode located on the discharge gap section.

6. A method for manufacturing an ESD protection device, the method comprising the steps of:
    printing, on one principal surface of a first ceramic green sheet, a discharge auxiliary electrode paste including metallic particles with an average particle diameter of about 1.0 μm or more, semiconductor particles, and an organic vehicle, at least one of the metallic particles and the semiconductor particles including, on surfaces thereof, a network-forming component of glass, and a combination of the metallic particles and the semiconductor particles having a ratio of about 7 volume % to about 25 volume % of the discharge auxiliary electrode paste, thereby forming an unfired discharge auxiliary electrode;

printing an opposed electrode paste on one principal surface of the first ceramic green sheet, thereby forming unfired opposed electrodes provided with an opposed electrode on one side and an opposed electrode on the other side, the opposed electrodes each partially covering the discharge auxiliary electrode, and the opposed electrodes are formed with at a distance therebetween;

stacking a second ceramic green sheet on the one principal surface of the first ceramic green sheet, thereby forming an unfired laminated body; and firing the laminated body to react surfaces of the metallic particles of the discharge auxiliary electrode with surfaces of the semiconductor particles, thereby producing a vitreous material.

7. The method for manufacturing an ESD protection device according to claim 6, wherein the metallic particles included in the discharge auxiliary electrode are alumina-coated Cu particles, and the semiconductor particles are silicon carbide particles.

* * * * *